(12) United States Patent
Shemesh

(10) Patent No.: US 6,894,294 B2
(45) Date of Patent: May 17, 2005

(54) SYSTEM AND METHOD FOR REDUCING CHARGED PARTICLE CONTAMINATION

(75) Inventor: Dror Shemesh, Petach-Tikva (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 10/600,886

(22) Filed: Jun. 19, 2003

(65) Prior Publication Data
US 2004/0046131 A1 Mar. 11, 2004

Related U.S. Application Data
(60) Provisional application No. 60/409,919, filed on Sep. 10, 2002.

(51) Int. Cl.[7] .................................................. G21G 5/00
(52) U.S. Cl. ........................ 250/492.21; 216/62; 56/643
(58) Field of Search ...................... 250/492.21; 216/62; 156/643

(56) References Cited

U.S. PATENT DOCUMENTS

| | | | | |
|---|---|---|---|---|
| 4,226,666 A | * | 10/1980 | Winters et al. | ............... 216/63 |
| 5,288,368 A | * | 2/1994 | DeMarco et al. | ............. 216/66 |
| 2002/0195422 A1 | * | 12/2002 | Sievers et al. | |

\* cited by examiner

Primary Examiner—Nikita Wells
Assistant Examiner—Zia R. Hashmi
(74) Attorney, Agent, or Firm—Blakely, Sokoloff, Taylor & Zafman

(57) ABSTRACT

A system and method for reducing ion contamination in an object, the ion contamination introduced by a contaminating ion beam milling step. The system includes means for defining a suspected ion contaminated area; and means for removing the suspected ion contaminated area by a non-contaminating process, which usually involves directing an electron beam towards the removed area while allowing the beam to interact with additional material. The method includes the steps of defining a suspected ion contaminated area; and removing the suspected ion contaminated area by non-contaminating process.

38 Claims, 5 Drawing Sheets

```
┌─────────────────────────────────────────────────────────────┐
│  milling the integrated circuit by a fast contaminating      │
│  milling process, thus introducing ion contamination         │
│                          210                                  │
└─────────────────────────────────────────────────────────────┘
                              │
┌─────────────────────────────────────────────────────────────┐
│           defining a suspected ion contaminated area         │
│                          220                                  │
└─────────────────────────────────────────────────────────────┘
                              │
┌─────────────────────────────────────────────────────────────┐
│    removing the suspected ion contaminated area by non-      │
│              contaminating charged particle beam             │
│                          230                                  │
└─────────────────────────────────────────────────────────────┘
```

SYSTEM AND METHOD FOR REDUCING CHARGED PARTICLE CONTAMINATION

RELATED APPLICATIONS

This application claims benefit of U.S. provisional application Ser. No. 60/409,919 filed at Sep. 9, 2002.

FIELD OF THE INVENTION

The present invention relates to systems and methods for preventing charged particle (such as but not limited to ion) contamination, and especially Gallium contamination in wafers.

BACKGROUND OF THE INVENTION

Scanning electron microscopes are known in the art. U.S. Pat. No. 5,659,172 of Wagner describes a method for reliable defect detection using multiple perspective Scanning Electron Microscope (SEM) images.

A SEM usually includes an electron gun for generating an electron beam, a SEM lens system for focusing and converging the electron beam, a deflection coil for deflecting the electron beam, a detector for detecting electrons, such as secondary emitted electron or reflected electrons that are emitted/reflected from an inspected object and a processor that is operative to construct SEM images in response to detection signals provided from the detector.

Usually, the electron gun, the SEM lens system and the deflection coil are located within a column that is commonly referred to as SEM column. Focused ion beam (FIB) systems are known in the art. FIB systems are generally utilized to perform milling of small areas within a die, and cross sectioning. The milled or cross-sectioned area is usually analyzed to inspect pattern profiles and to detect defects. FIB systems can also be utilized to generate FIB images.

FIB systems usually include an ion source for generating an ion beam, a FIB lens system for focusing the ion beam to provide a focused ion beam and an ion beam deflector for deflecting the focused ion beam. Typically, a broad ion beam is utilized for an initial milling step, while a narrower ion beam is utilized for a successive step of polishing the walls of the cross sectioned wafer.

A FIB system that is operative to generate a FIB image also has a detector and a processor. Usually, the ion source, the FIB lens system and the ion beam deflector are located within a column that is commonly referred to as FIB column. The detector can also be placed within the FIB column.

Systems that include both FIB and SEM systems are known in the art and are referred to as FIB/SEM systems. Such a system is the XL860 DualBeam Workstation of FEI.

A common FIB ion source generates Gallium ion beams. When a focused Gallium ion beam is directed towards an area at the surface of an integrated circuit it removes a portion of that area to form a cavity defined by cavity defining walls. The Gallium ion beam also contaminates that integrated circuit, as illustrated by "Defects and Gallium—Contamination During Focused Ion Beam Micro Machining", By C. Leher, L. Frey, S. Peterson, M. Mizutani, H. Ryssel, and "Implemented gallium-ion concentrations of focused-ion beam prepared cross sections", T. Ishitani and others, 1907 Journal of Vacuum Science Technology, B 16(a), July/August 1998.

Some prior art methods suggest a reduction of ion contamination during the processing steps of a semiconductor. U.S. Pat. Nos. 5,306,945 and 6,114,222 are believed to provide an adequate description of the state of the art.

U.S. Pat. No. 5,306,945 of Drummond suggests to reduce ion contamination by providing an integrated circuit that includes a barrier for terminating the edge of a semiconductor die. The barrier reduces contamination of the dielectric layers such as TEOS and BPSG from mobile ions which are inherent in fabrication materials. While the barrier can be formed at many points in the die fabrication process, its formation is preferably incorporated into the Metal1 mask.

U.S. Pat. No. 6,114,222 of Thakur describes a method for reducing ion contamination. The method includes forming active field effect transistors in a starting substrate; forming a first insulating layer over the field effect transistor and the field oxide; forming a second insulating layer over the first insulating layer; and performing an annealing step in a nitrogen containing gas ambient prior to exposing the insulating layer to mobile ion impurities. Thakur further suggests another method to cure mobile ion contamination during semiconductor processing by annealing an insulating layer in a nitrogen containing gas ambient prior to exposing said insulating layer to mobile ion impurities.

SUMMARY OF THE INVENTION

The invention provides a method for reducing ion contamination in an object, especially an integrated circuit, the ion contamination introduced by a contaminating ion beam milling step, the method includes a first step of defining a suspected ion contaminated area and a second step of removing the suspected ion contaminated area by non-contaminating removal process. Conveniently, the non-contaminating process involves directing an electron beam at the presence of an additional material, towards the object to be milled. The additional material is usually in gaseous state and cab be selected from a variety of prior art materials known for enhancing or allowing milling. The additional material can be a XeF2 (Xenon di-Flouride) gas, but this is not necessarily so.

The invention provides a system for reducing ion contamination in an object, the ion contamination introduced by a contaminating ion beam milling step, the system includes means for defining a suspected ion contaminated area; and means for removing the suspected ion contaminated area by a non contaminating process.

The invention provides a system for milling an integrated circuit, the system includes: means for fast contaminated milling of the integrated circuit, means for defining a suspected ion contaminated area, and means for non-contaminating removal of the suspected ion contaminated area. The system can also fill the decontaminated hole with a pre-selected material.

The invention provides a method for milling an integrated circuit, the method includes: milling the integrated circuit by a fast contaminating milling process, thus introducing ion contamination, defining a suspected ion contaminated area; and removing the suspected ion contaminated area by a non contaminating process. After applying the non-contamination process, the system can cover the milled hole by an electron beam enhanced deposition of different materials, for example Silicon.

Conveniently, the contaminating ion beam is a Gallium ion beam, while the non-contaminating removal process involves directing an electron beam to interact with additional material.

The area may be defined in response to at least one contamination parameter. Said parameter may be (i) the area that was exposed to ion beam, (ii) at least one temperature of the integrated circuit during a time period that starts at the contaminating milling step and ends at the step of removing the suspected ion contaminated area, (iii) the time period between the contaminating ion beam milling step and the step of removing the suspected ion contaminated area, and/or (iiii) the materials from which the milled object is made of, and especially the behavior of Gallium ions within said materials. The parameter may also reflect the arrangement/topography of said materials.

The method can be implemented during the manufacturing of the integrated circuit, and/or during an inspection process.

BRIEF DESCRIPTION OF THE DRAWINGS

The present invention will be more fully understood from the following detailed description of the embodiments thereof, taken together with the drawings in which:

FIGS. 4a–4b are flow charts illustrating methods for eliminating charged particle contamination, in accordance with embodiments of the invention.

DETAILED DESCRIPTION OF THE DRAWINGS

Figure 1B:
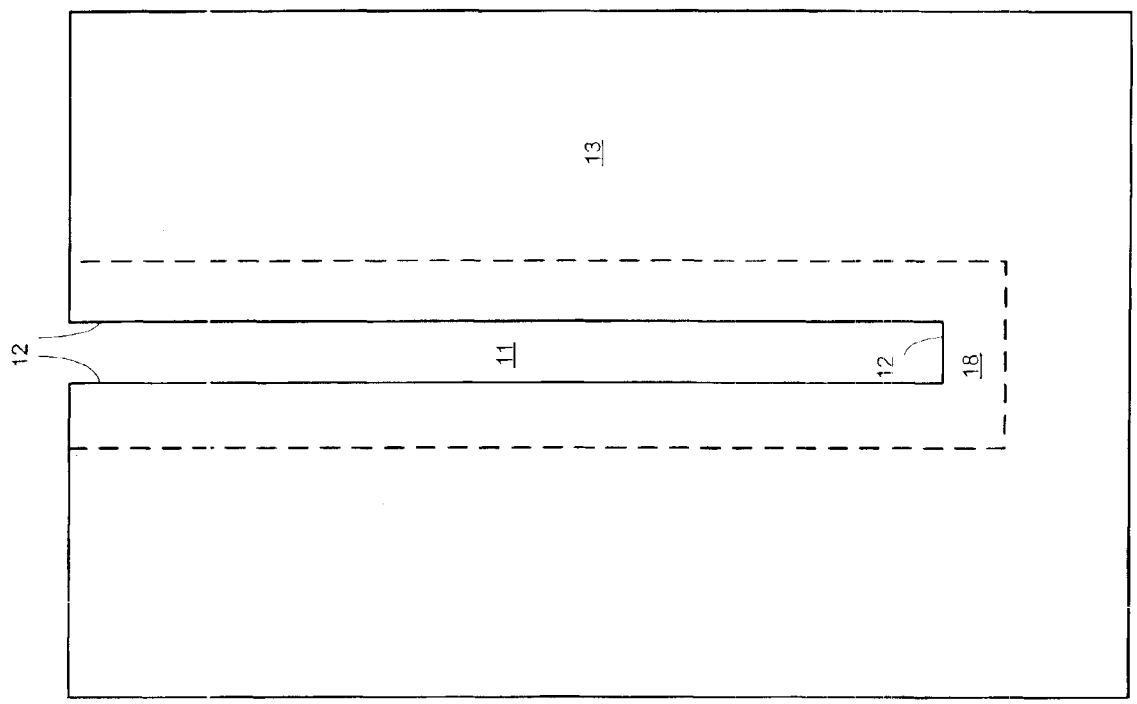
FIGS. 1a–1b are a cross sectional view and a top view of an area that includes a cavity that was formed by a contaminating milling process.

It should be noted that the particular terms and expressions employed and the particular structural and operational details disclosed in the detailed description and accompanying drawings are for illustrative purposes only and are not intended to in any way limit the scope of the invention as described in the appended claims.

The following description related to Gallium ion beams, but the invention is also applicable when handling contaminating charged particle beams.

The invention is based on the following observations: (1) During a limited time period after a FIB was directed onto an area of a wafer, to provide a cavity defined by cavity defining walls, the Gallium ions are concentrated in close proximity to the surface of the cavity defining walls. (2) Gallium ions penetration is responsive to beam energy, the ion dose, and the time that elapsed from the formation of the cavity and is further responsive to the temperature of the cavity and of the cavity defining walls. (3) Gallium ions may change the electrical properties of wafer elements, such as PN junctions, transistors and the like.

Referring to the first assumption, research has shown that the most of the Gallium ions are concentrated (immediately after the cavity was formed) within few nanometers (or even tens nanometers) from the cavity defining walls. It is noted that the cavity may be several microns deep.

Referring to the second assumption, if the Gallium contamination is not prevented or at least dramatically reduced, Gallium ions may propagate from the cavity defining walls (that are included in a non-operative die due to various factors including the cross sectioning) to other dies, thus causing other dies to malfunction.

Furthermore, also in relation to the second assumption, a wafer usually has multiple layers and is fabricated in a multi-staged process that may include repetitive series of steps. A wafer may be cross-sectioned by FIB during the multi-staged process, either in a predefined manner, or as response to a suspected failure or defect of the wafer. At least some of the stages of wafer fabrication include subjecting the wafer to very high temperatures (hundreds and even few thousand centigrade). Thus, the Gallium ion propagation is accelerated during these heating inclusive stages.

According to an aspect of the invention Gallium contamination is eliminated or at least substantially reduced by a non-contaminating removal step of removing a suspected contaminated area. The suspected contaminated area includes integrated circuit material, starting from the cavity defining walls, in which at least a predefined amount of Gallium ions may be located.

The suspected contaminated area may be determined in view of measurements of previously milled integrated circuits and/or may be based on a model of Gallium contamination that takes into account ion energy and dose, the materials of the milled integrated circuit and the expected propagation of the Gallium through them, the time period that starts from the contaminating milling step and the time of the non-contaminating removal process and the temperatures to which the cavity defining walls were subjected during that period. The length of these time period as well as the temperatures to which the object is subjected are available from the tools that are used to mill the object, and/or process it, as the manufacturing process is usually characterized by a high degree of monitoring.

In cases where the temperatures are not measured/monitored a rough estimation can be provided, as manufacturing processes are characterized by a relatively fixed set of operations.

Conveniently, the non-contaminating milling process is implemented by electron beams, and is performed before the milled wafer is subjected to high temperatures.

Usually, the non-contaminating milling process is much slower than the FIB milling process, but as the non-contaminating milling process has to remove a substantially fewer amount of material from the wafer, the overall process is relatively time-efficient.

It is noted that the non-contaminating milling process may be accelerated by injecting non-contaminating materials in the path of the electron beam being directed towards the wafer during the non-contaminating milling process.

Figure 1A:
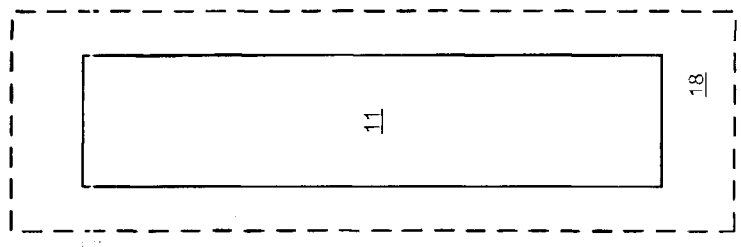

Referring to FIGS. 1a–1b illustrating a cross section view and a top view of an area 10 that includes a cavity 11 that was formed by a contaminating milling process, cavity 11 is defined by cavity defining walls 12 that are surrounded by integrated circuits 13.

The potentially contaminated area 18 starts at the cavity defining walls and extends throughout integrated circuit 13.

The potentially contaminated area 18 of FIGS. 1a–1b is determined based on the following assumptions: the contaminating milling occurred recently and that the wafer was not subjected to high temperatures since that milling.

The depth and/or width of a cavity can range between few nanometers to few microns. Wider cavities can be inspected with a tilted electron beam, while narrow cavities may be formed for other purposes. The suspected area 18 is about 40 nanometers deep.

Although FIGS. 1a–1b illustrate a vertical cavity, this is not necessarily so, as other shaped cavities may be formed. The milling process may be utilized for a preparation of TEM samples, but this is not necessarily so as the integrated circuit may be cross sectioned for imaging the cross sectioned area by other tools, including SEM, and especially SEMs that may generate an electronic bean that is oriented towards the wafer surface in an angle that differs than ninety degrees.

Figure 2B:
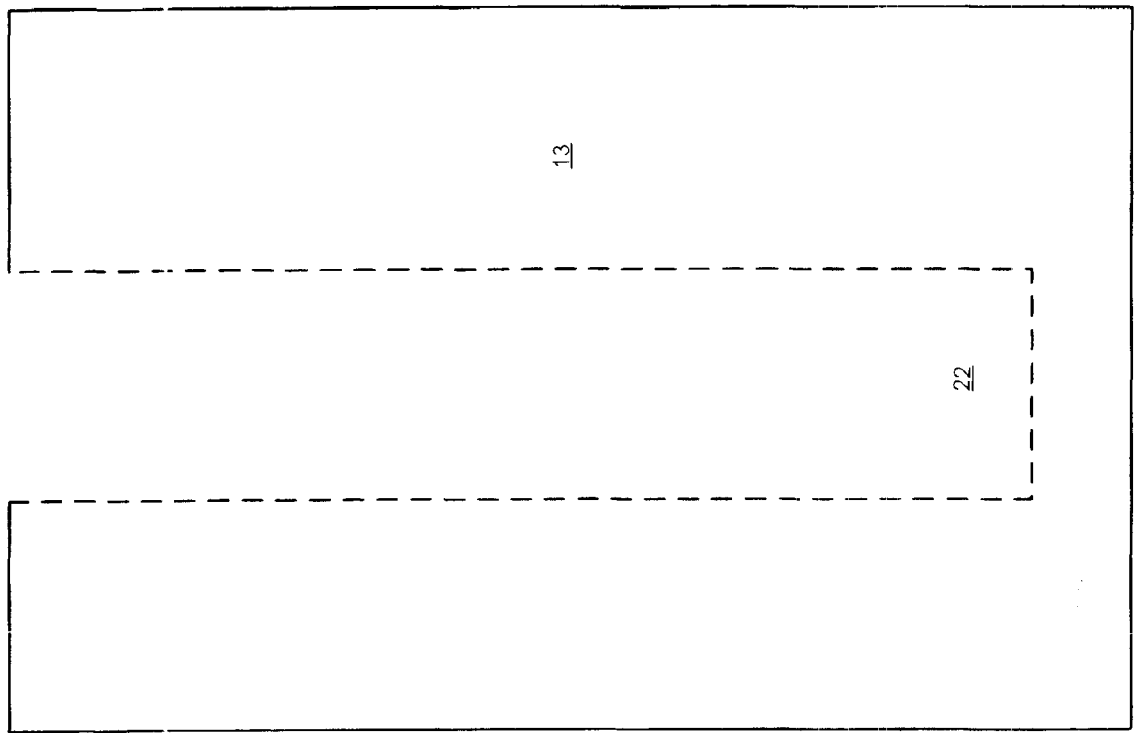
FIG. 2 illustrates an area after a non-contaminating removal process is implemented, in accordance with an embodiment of the invention.
Figure 2A:

FIG. 2 illustrates area 11 after a non-contaminating milling process is implemented. Area 10 includes an extended cavity 22 that was formed by a contaminating milling process and the non-contaminating milling process. Extended cavity 22 includes what was previously cavity 11 and the potentially contaminated area 18. Extended cavity 22 may be larger than cavity 11 and suspected contaminated area, but this is not necessarily so.

It is noted that the contaminating milling and the non-contaminating removal process may be implemented by FIB column and SEM column that are oriented towards each other and are focused to the same area, but may also be implemented by spaced apart FIB and FIB, as illustrated in patent application Ser. No. 10/005,190 Titled "System and method for directing a miller", filed Nov. 26, 2001.

Figure 3:
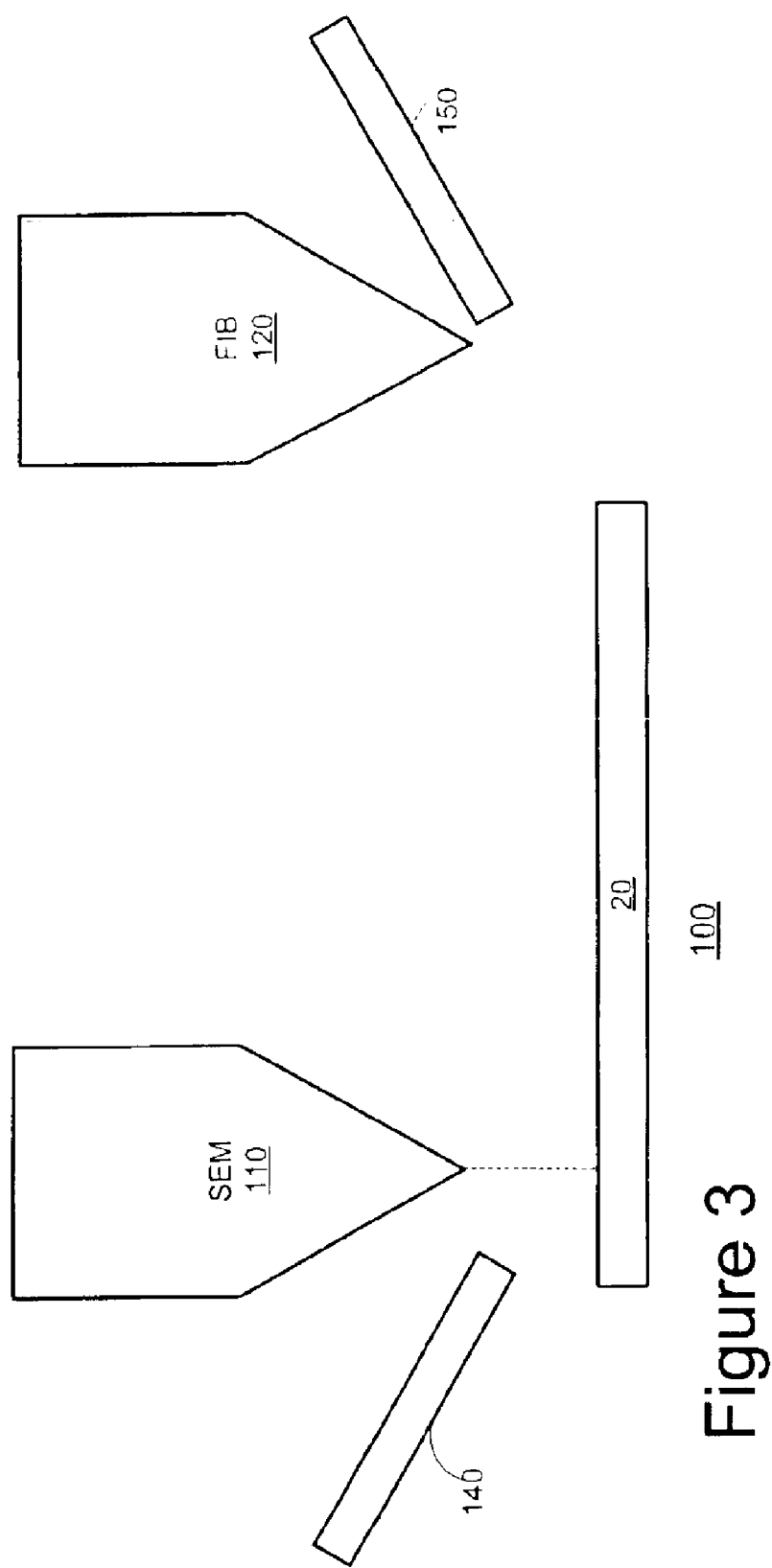
FIG. 3 is an overall view of a milling system, in accordance with an embodiment of the invention.

FIG. 3 illustrates an exemplary milling system 100, in accordance with a preferred embodiment of the invention. Milling system 100 includes SEM 110 and FIB generator 120, operative to perform contaminating milling and non-contaminating removal process, and in communication with each other to enable milling a cavity by a contaminating milling process and milling a corresponding enlarged cavity by non-contaminating milling.

SEM 110 includes a processor for defining a suspected ion contaminated area, although said processor may be located in other locations, such as within FIB generator 120, or in another remote location. The processor executes dedicated software for calculating the area and may utilize prior art models of Gallium propagation. It is noted that other hardware and/or software combination may be utilized for calculating said area. The calculation may be responsive to the topography (arrangement) of materials at the vicinity of the cavity, as well as their characteristics.

Milling system 100 further includes: (i) a controllable stage 20, for moving the inspected object from a first location in which the inspected object is accessible to the SEM 110 a second location in which the inspected object is accessible to FIB generator 120; and (ii) gas injectors 140 and 150. Gas injector 140 is located at the vicinity of the first location for providing materials to interact with an electron beam provided by SEM 110 to accelerate the non-contaminating milling, while gas injector 150 is located at the vicinity of the second location to accelerate the milling of the inspected object by the Gallium ion beam.

FIG. 4a illustrates method 200 for milling an integrated circuit. Method 200 includes step 210 of milling the integrated circuit by a fast contaminating milling process, thus introducing ion contamination, step 220 of defining a suspected ion contaminated area, and step 230 of removing the suspected ion contaminated area by the non-contaminating removal process.

Figure 4B:
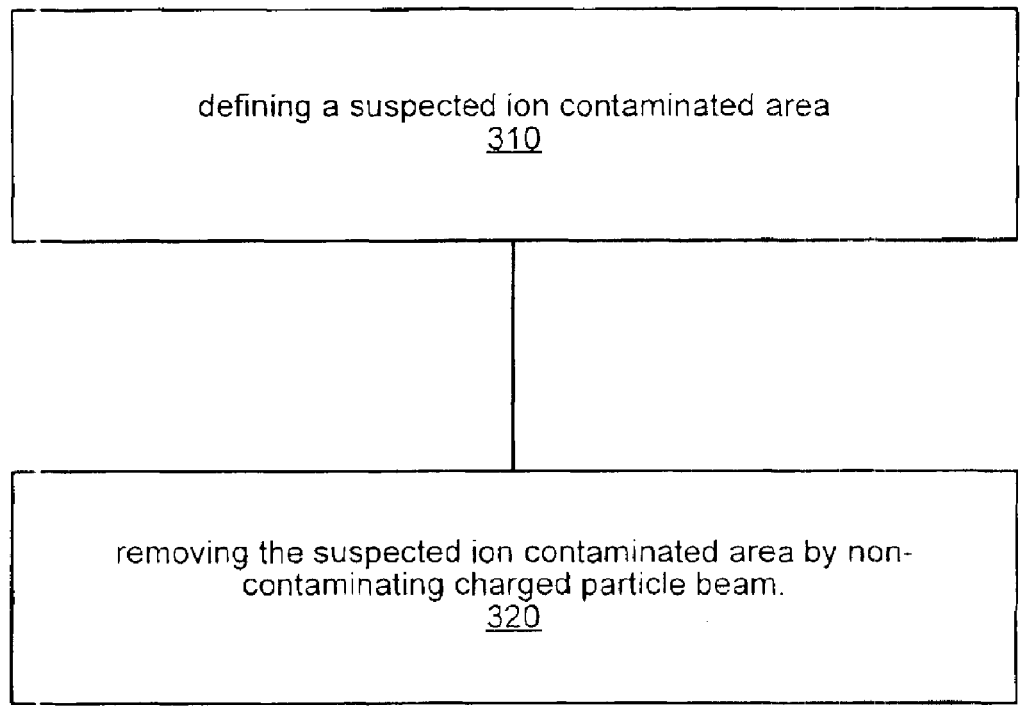

FIG. 4b illustrates method 300 for reducing ion contamination in an object, the ion contamination introduced by a contaminating ion beam milling step, the method includes step 310 of defining a suspected ion contaminated area and step 320 of removing the suspected ion contaminated area by the non-contaminating removal process.

It will thus be appreciated that the preferred embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

We claim:

1. A method for reducing ion contamination in an object, the ion contamination introduced by a contaminating ion beam milling step, the method comprising the steps of:
   defining a suspected ion contaminated area; and
   removing the suspected ion contaminated area by a non-contaminating process.

2. The method of claim 1 wherein the contaminating ion beam is a Gallium ion beam.

3. The method of claim 1 wherein the step of defining comprising calculating a suspected ion contaminated area in response to at least one contamination parameter.

4. The method of claim 3 wherein the at least one contamination parameter includes at least one temperature of the integrated circuit during a time period that starts at the contaminating milling step and ends at the step of removing the suspected ion contaminated area.

5. The method of claim 3 wherein at least one contamination parameter is the time period between the contaminating ion beam milling step and the step of removing the suspected ion contaminated area.

6. The method of claim 3 wherein the calculation is responsive to the materials from which the milled object is made of.

7. The method of claim 1 wherein the object is an integrated circuit.

8. The method of claim 1 wherein the object includes at least a substrate and at least one conductive layer.

9. The method of claim 1 wherein the steps of defining and removing are included within a fabrication process of the object.

10. The method of claim 1 wherein the steps of defining and removing are included within an inspection process of the object.

11. The method of claim 1 wherein during a period that begins at the contaminating ion beam milling step and ends at the step of removing the object is maintained in a relative low temperature.

12. A method for milling an integrated circuit, the method comprising the steps of:
    milling the integrated circuit by a fast contaminating milling process, thus introducing ion contamination;
    defining a suspected ion contaminated area; and
    removing the suspected ion contaminated area by non-contaminating process.

13. The method of claim 12 wherein the contaminating ion beam is a Gallium ion beam.

14. The method of claim 12 wherein the step of defining comprising calculating a suspected ion contaminated area in response to at least one contamination parameter.

15. The method of claim 14 wherein the at least one contamination parameter includes at least one temperature of the integrated circuit during a time period that starts at the contaminating milling step and ends at the step of removing the suspected ion contaminated area.

16. The method of claim 14 wherein at least one contamination parameter is the time period between the contaminating ion beam milling step and the step of removing the suspected ion contaminated area.

17. The method of claim 14 wherein the calculation is responsive to the materials from which the milled object is made of.

18. The method of claim 12 wherein the object is an integrated circuit.

19. The method of claim 12 wherein the object includes at least a substrate and at least one conductive layer.

20. The method of claim 12 wherein the steps of defining and removing are included within a fabrication process of the object.

21. The method of claim 12 wherein the steps of defining and removing are included within an inspection process of the object.

22. The method of claim 12 wherein during a period that begins at the contaminating ion beam milling step and ends at the step of removing the object is maintained in a relative low temperature.

23. A system for reducing ion contamination in an object, the ion contamination introduced by a contaminating ion beam milling step, the system comprising:

means for defining a suspected ion contaminated area; and means for removing the suspected ion contaminated area by a non-contaminating process.

24. The system of claim 23 wherein the contaminating ion beam is a Gallium ion beam.

25. The system of claim 23 wherein means for defining are capable of calculating a suspected ion contaminated area in response to at least one contamination parameter.

26. The system of claim 25 wherein the at least one contamination parameter includes at least one temperature of the integrated circuit during a time period that starts at the contaminating milling step and ends at the step of removing the suspected ion contaminated area.

27. The system of claim 25 wherein at least one contamination parameter is the time period between the contaminating ion beam milling step and the step of removing the suspected ion contaminated area.

28. The system of claim 25 wherein the calculation is responsive to the materials from which the milled object is made of.

29. The system of claim 23 wherein the object is an integrated circuit.

30. The system of claim 23 wherein the object includes at least a substrate and at least one conductive layer.

31. The system of claim 23 wherein during a period that begins at the contaminating ion beam milling step and ends at the step of removing the object is maintained in a relative low temperature.

32. A system for milling an integrated circuit, the system comprising:

means for fast contaminated milling of the integrated circuit;

means for defining a suspected ion contaminated area; and means for non-contaminating removal of the suspected ion contaminated area.

33. The system of claim 32 wherein the means for fast contaminated milling is capable of directing a Gallium ion beam towards the integrated circuit.

34. The system of claim 32 wherein means for defining are capable of calculating a suspected ion contaminated area in response to at least one contamination parameter.

35. The system of claim 34 wherein the at least one contamination parameter includes at least one temperature of the integrated circuit during a time period that starts at the contaminating milling step and ends at the step of removing the suspected ion contaminated area.

36. The system of claim 34 wherein at least one contamination parameter is the time period between the contaminating ion beam milling step and the step of removing the suspected ion contaminated area.

37. The system of claim 34 wherein the calculation is responsive to the materials from which the milled object is made of.

38. The system of claim 32 wherein during a period that begins at the contaminating ion beam milling step and ends at the step of removing the object is maintained in a relative low temperature.

* * * * *